United States Patent [19]

Dietz

[11] 4,193,018
[45] Mar. 11, 1980

[54] DEFLECTION CIRCUIT

[75] Inventor: Wolfgang F. W. Dietz, New Hope, Pa.

[73] Assignee: RCA Corporation, New York, N.Y.

[21] Appl. No.: 944,012

[22] Filed: Sep. 20, 1978

[51] Int. Cl.² .......................................... H01J 29/70
[52] U.S. Cl. ................................................. 315/408
[58] Field of Search ........................................ 315/408

[56] References Cited

U.S. PATENT DOCUMENTS

| 3,441,791 | 4/1969 | Beck ........................... 315/408 |
| 3,452,244 | 6/1969 | Dietz ........................... 315/408 |
| 3,749,966 | 7/1973 | Ahrens et al. .............. 315/408 |
| 3,767,960 | 10/1973 | Ahrens ....................... 315/408 |
| 3,789,260 | 1/1974 | Ahrens ....................... 315/408 X |
| 3,801,856 | 4/1974 | Griepentrog et al. ...... 315/408 X |
| 3,832,595 | 8/1974 | Dietz ........................... 315/408 X |
| 3,920,892 | 11/1975 | Dietz ........................... 178/7.3 R |
| 3,936,115 | 2/1976 | Dietz ........................... 315/408 X |
| 3,993,931 | 11/1976 | den Hollander ........... 315/408 |
| 4,104,569 | 8/1978 | Förster et al. .............. 315/408 |

FOREIGN PATENT DOCUMENTS 2408301  9/1974  Fed. Rep. of Germany ........... 315/408

Primary Examiner—Malcolm F. Hubler
Attorney, Agent, or Firm—Eugene M. Whitacre; Paul J. Rasmussen; Joseph J. Laks

[57] ABSTRACT

A trace current is generated in a horizontal deflection winding upon closure of a trace switch. A retrace capacitor forms a resonant retrace circuit with the deflection winding upon open-circuiting of the trace switch. A second resonant circuit is coupled to an energy supply and stores energy when the trace switch is closed. A second switch couples the resonant retrace circuit to the second resonant circuit during retrace. The stored energy in the second resonant circuit is then transferred to the resonant retrace circuit and to other load circuits, such as a flyback transformer.

15 Claims, 11 Drawing Figures

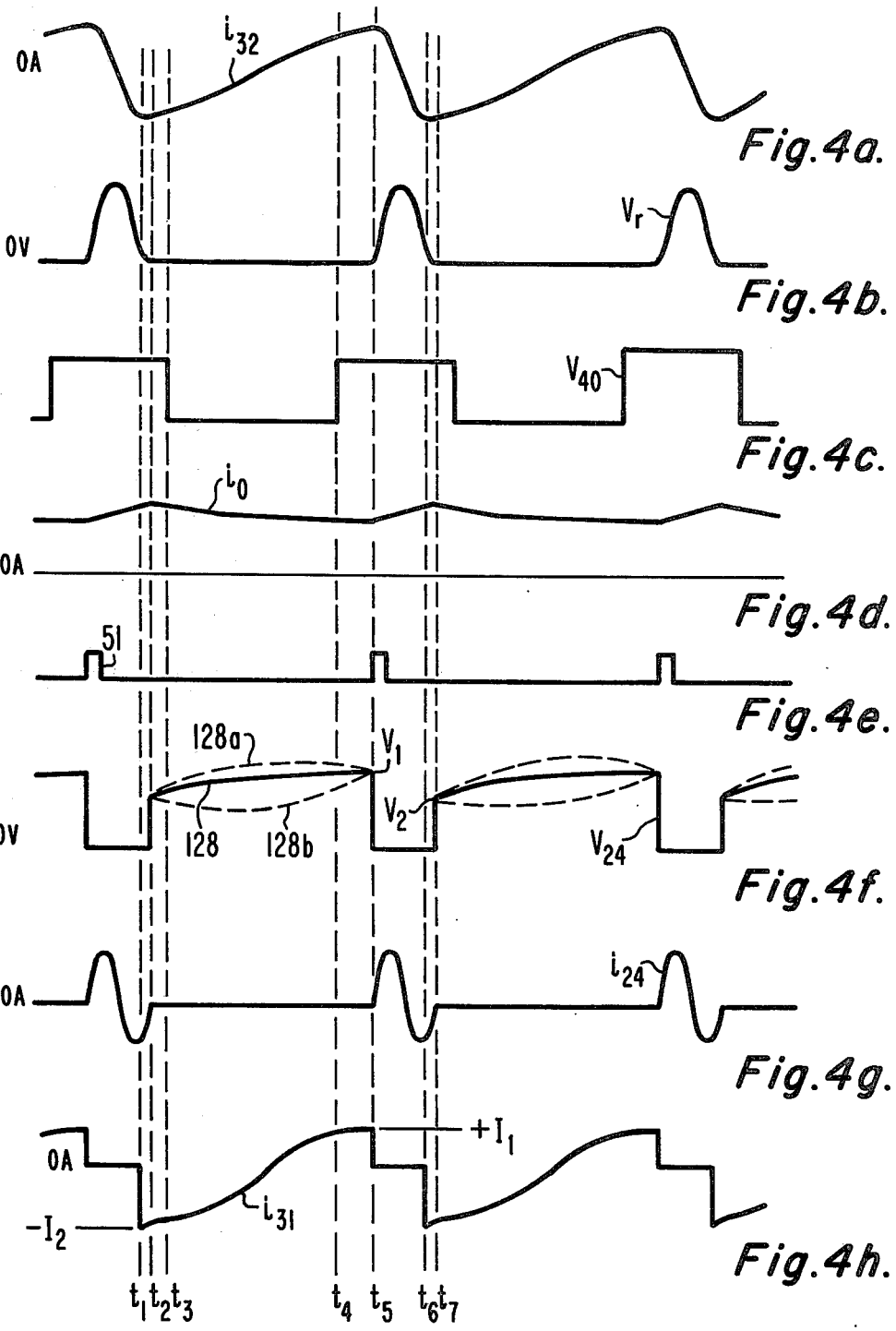

DEFLECTION CIRCUIT

BACKGROUND OF THE INVENTION

This invention relates to deflection circuits for television receivers, for example.

In many horizontal deflection circuits, the deflection winding is series coupled with an "S" shaping capacitor that is charged to a DC voltage. A trace switch, such as a horizontal output transistor and a parallel damper diode, is coupled across this series arrangement. When the trace switch closes during the trace interval, the DC voltage developed across the deflection winding generates a sawtooth trace current in the winding.

A primary winding of a flyback transformer is coupled between a voltage supply terminal and the horizontal output transistor collector electrode. During trace, current flows in the primary winding, storing energy in the winding magnetic field, which is then transferred to load circuits coupled to the flyback transformer, such as the high voltage ultor, during retrace when the deflection winding and a retrace capacitor go through one-half cycle of resonant oscillation.

Because the trace switch is coupled to the flyback primary winding, the reflected DC load current flowing in the primary winding causes the collector current in the horizontal output transistor to be increased at the end of trace. More base drive is required to maintain the transistor in saturation.

Also with the primary winding coupled to a voltage supply, such as a rectified AC line mains voltage, the output stage of the horizontal deflection circuit is not electrically isolated from the supply. It is desirable to isolate as many of the television receiver circuits as feasible to further reduce electrical shock hazard.

SUMMARY OF THE INVENTION

A trace switch coupled to a deflection winding generates a trace current in the winding when the trace switch is closed. A first resonant circuit stores energy from a supply in this interval. When the trace switch opens the deflection winding and a retrace capacitor form a resonant retrace circuit. A second switch closes during retrace and couples during retrace the first resonant circuit to the resonant retrace circuit for transferring energy to the resonant retrace circuit and to other loads coupled to the resonant retrace circuit.

BRIEF DESCRIPTION OF THE DRAWING

FIGS. 4a–4h illustrate waveforms associated with the circuits of FIG. 1 and 3.

DESCRIPTION OF THE INVENTION

Figure 1:
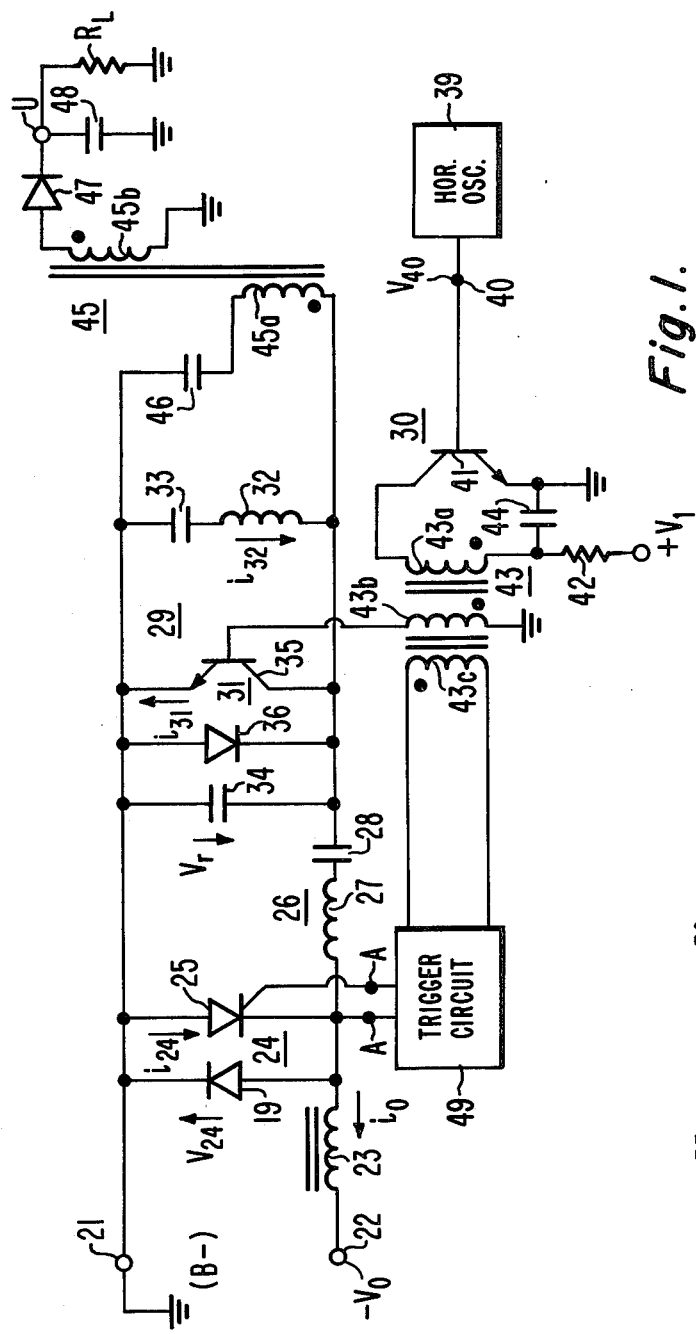
FIG. 1 illustrates a deflection circuit embodying the invention.

In FIG. 1, a source of B− supply voltage, illustratively of $V_0$ volts magnitude, is coupled across terminals 21 and 22 and provides supply energy for a horizontal deflection circuit 30 embodying the invention. The B− supply may be obtained, for example, by rectification and filtering of the AC line mains voltage, not illustrated. Terminal 22 is coupled through an input choke inductor 23 to the cathode of an SCR 25 of a controllable bidirectional switch 24. The anode of SCR 25 is coupled to terminal 21. An oppositely poled diode 19 of switch 24 is coupled across SCR 25.

The junction of inductor 23 and switch 24 is coupled to a resonant energy storage circuit 26 comprising a series coupled inductor 27 and capacitor 28. Resonant circuit 26 is coupled to an output stage 29 of horizontal deflection circuit 30. Output stage 29 comprises a trace switch 31, a series coupled horizontal deflection winding 32 and DC blocking and "S" shaping capacitor 33, and a retrace capacitor 34. Trace switch 31 comprises a horizontal output transistor 35, with a collector electrode coupled to a junction terminal of resonant circuit 26 and retrace capacitor 34, and includes an oppositely poled damper diode 36.

The DC voltage across capacitor 33 is coupled across the deflection winding 32 during the trace interval when trace switch 31 is closed. As illustrated in FIG. 4a, the horizontal deflection current $i_{32}$ flowing in horizontal deflection winding 32 is negative during a first portion of the trace interval $t_1$–$t_5$ and is positive during the latter portion.

During horizontal retrace, between times $t_5$–$t_6$, with trace switch 31 open-circuited, a resonant retrace circuit is formed by retrace capacitor 34 and deflection winding 32. One-half cycle of resonant oscillation occurs, and the deflection current $i_{32}$ reverses direction. The voltage across retrace capacitor 34 and trace switch 31 equals a retrace pulse voltage $V_r$ during the retrace interval $t_5$–$t_6$, as illustrated in FIG. 4b. At the end of retrace at time $t_6$, when damper diode 36 becomes forward biased, trace switch 31 closes and begins to conduct the trace portion of deflection current $i_{32}$.

A conventional horizontal oscillator 39 provides at a terminal 40, a synchronized horizontal rate drive control signal $V_{40}$, as illustrated in FIG. 4c, to the base of a driver transistor 41 for providing a control signal to horizontal output transistor 35 to turn the transistor on and off. Collector voltage for driver transistor 41 is obtained from a $+V_1$ supply through a resistor 42 and a primary winding 43a of a coupling transformer 43. A first secondary winding of coupling transformer 43 is coupled to the base of horizontal output transistor 35. A capacitor 44 is coupled between ground and the junction of resistor 42 and the primary winding of transformer 43.

At time $t_3$, in the first portion of the horizontal trace interval, at a trailing edge of drive signal $V_{40}$, as illustrated in FIG. 4c, the base-emitter junction of horizontal output transistor 35 is forward biased. Transistor 35 then conducts positive trace switch current $i_{31}$ during the latter portions of the trace interval. At time $t_4$, at a leading edge of drive signal $V_{40}$, a reverse bias control voltage is applied across the base-emitter junction of transistor 35. After a relatively short interval, at time $t_5$, depending upon the storage time delay of transistor 35, transistor 35 cuts off, initiating the resonant retrace interval $t_5$–$t_6$. Resistor 42 and capacitor 44 waveshape the reverse base voltage of transistor 35 to provide for proper cutoff of the transistor.

During the resonant retrace interval, load energy is transferred from the resonant retrace circuit comprising retrace capacitor 34 and deflection winding 32 to various loads coupled to the retrace circuit. As illustrated in FIG. 1, a load resistor $R_L$, representative, illustratively of an ultor beam current load, is coupled to the retrace circuit through a horizontal output or flyback transformer 45.

A series coupled arrangement of a flyback primary winding 45a and a DC blocking capacitor 46 is coupled across retrace capacitor 34. A high voltage secondary winding 45b is coupled through a diode 47 to an ultor terminal U. Load resistor $R_L$ is coupled to terminal U. An ultor capacitance 48 filters AC ripple voltage components. During horizontal retrace, diode 47 becomes forward biased, and a reflected load current component flows in flyback primary winding 45a, loading down and transferring energy from the resonant retrace circuit.

Resonant energy storage circuit 26 is supplied with energy during the trace interval. With the inductance of choke 23 relatively large, choke 23 and the B— supply coupled to terminals 21 and 22 function as a current source for supplying an input current $i_0$, as illustrated in FIG. 4d. As illustrated in FIGS. 4f and 4g, between times $t_2$–$t_5$, switch 24 is open circuited. Capacitor 28 of resonant circuit 26 charges from the input current $i_0$, as illustrated by waveform 128 of FIG. 4f, storing energy in capacitor 28. With the inductance of choke 23 relatively large, choke 23 and the B— supply coupled to terminals 21 and 22 function as a current source for supplying an input current $i_0$, as illustrated in FIG. 4d.

A conventional trigger circuit 49 couples horizontal rate gating signals 51 illustrated schematically in FIG. 4e, through terminals A—A to the gate-cathode of SCR 25 of bidirectional switch 24. Synchronization within each horizontal deflection cycle is achieved by coupling to trigger circuit 49, through a secondary winding 43c of coupling transformer 43, the horizontal rate drive signal $V_{40}$ developed at terminal 40.

Figure 2:
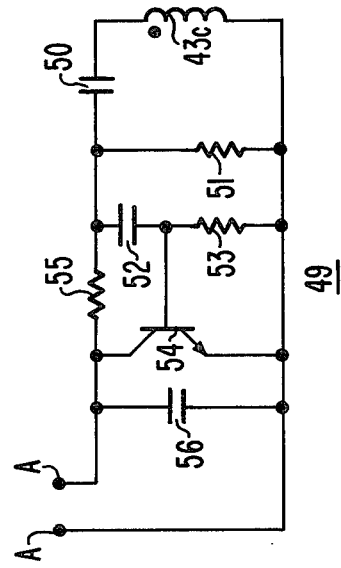
FIG. 2 illustrates an embodiment of a trigger circuit of FIG. 1.

As illustrated in FIG. 2 for an illustrative embodiment of a trigger circuit 49, drive signal $V_{40}$ is differentiated once by a capacitor 50 and a resistor 51 that are coupled across winding 43c. The base of a transistor 54 is coupled to a second differentiating circuit at the junction of a capacitor 52 and a resistor 53. Terminals A—A are coupled across the collector-emitter electrodes of transistor 54. Terminals A—A are also coupled across a capacitor 56 of an integrating circuit comprising a resistor 55 and capacitor 56.

As illustrated by FIGS. 4c, and 4e, trigger circuit 49 functions as a delay network such that gating signal 51, schematically illustrated in FIG. 4e as a pulse voltage, is coincident with the beginning of retrace at time $t_5$. The leading edge of $V_{40}$, at time $t_4$, maintains transistor 54 conducting until capacitor 52 has charged sufficiently to turn off transistor 54. A further delay is provided by the integrating circuit of resistor 55 and capacitor 56, until time $t_5$, at which time SCR 25 is gated into conduction.

At time $t_5$, the beginning of retrace, gating signal 51, gates SCR 25 and switch 24 into conduction, thereby disconnecting resonant circuit 26 from the B— supply. At the same time, trace switch 31 becomes open-circuited, forming the resonant retrace circuit. As illustrated in FIG. 4g by the current $i_{24}$ flowing in switch 24, resonant circuit 26 undergoes one complete cycle of oscillation between times $t_5$–$t_7$, the interval encompassing the entire retrace interval.

During the retrace interval $t_5$–$t_6$, energy stored in capacitor 28 of resonant circuit 26 is transferred to the resonant retrace circuit and to the load circuits coupled to flyback transformer 45. As illustrated in FIG. 4g, shortly after the end of the retrace interval, the current $i_{24}$ in bidirectional switch 24 attempts to reverse direction, reverse biasing diode 19. With gating signals 51 absent, SCR 25 remains nonconductive, and bidirectional switch 24 becomes open-circuited near time $t_7$. Thus the current flowing in resonant circuit 26 commutates off switch 24 near time $t_7$.

The voltage $V_{24}$ across bidirectional switch 24 during its nonconduction approximately equals the voltage across capacitor 28 of resonant energy storage circuit 26. At the beginning of retrace, at time $t_5$, the input current $i_0$ has charged capacitor 28 to a peak voltage $V_1$, as illustrated in FIG. 4f. At the end of one complete cycle of resonant oscillation of circuit 26 at time $t_7$, energy has been transferred from resonant circuit 26. The voltage across capacitor 28 is now of a lower peak magnitude $V_2$. During the subsequent trace charging interval, capacitor 28 is recharged to the peak voltage $V_1$.

The oscillation frequency of resonant circuit 26 may be selected as approximately twice the horizontal retrace frequency, providing for one complete cycle of oscillation within which energy may be tranferred to the resonant retrace circuit. If an SCR rather than an ITR is used as a switch 24, the oscillation frequency of resonant circuit 26 may then be selected as approximately equal to the horizontal retrace frequency. With only an SCR used, the current $i_{24}$ undergoes only one-half cycle of oscillation within which energy is tranferred to the retrace circuit, with a consequent increase in peak-to-peak voltage developed across the SCR during its nonconduction interval.

The current $i_{31}$ through trace switch 31 is illustrated in FIG. 4h. When bidirectional switch 24 is open-circuited, between times $t_2$–$t_5$, the trace switch current $i_{31}$ equals the algebraic sum of the input current $i_0$ and the deflection current $i_{32}$. At the end of trace, at time $t_5$, when horizontal output transistor 35 is conductive, the input current $i_0$ and the deflection current $i_{32}$ flow in opposite directions through trace switch 31. The peak positive current $+I_1$, is of lesser magnitude then the peak negative current $-I_2$. The net collector current flowing through transistor 35 is therefore decreased when compared with conventional transistorized horizontal deflection circuits.

Figure 3:
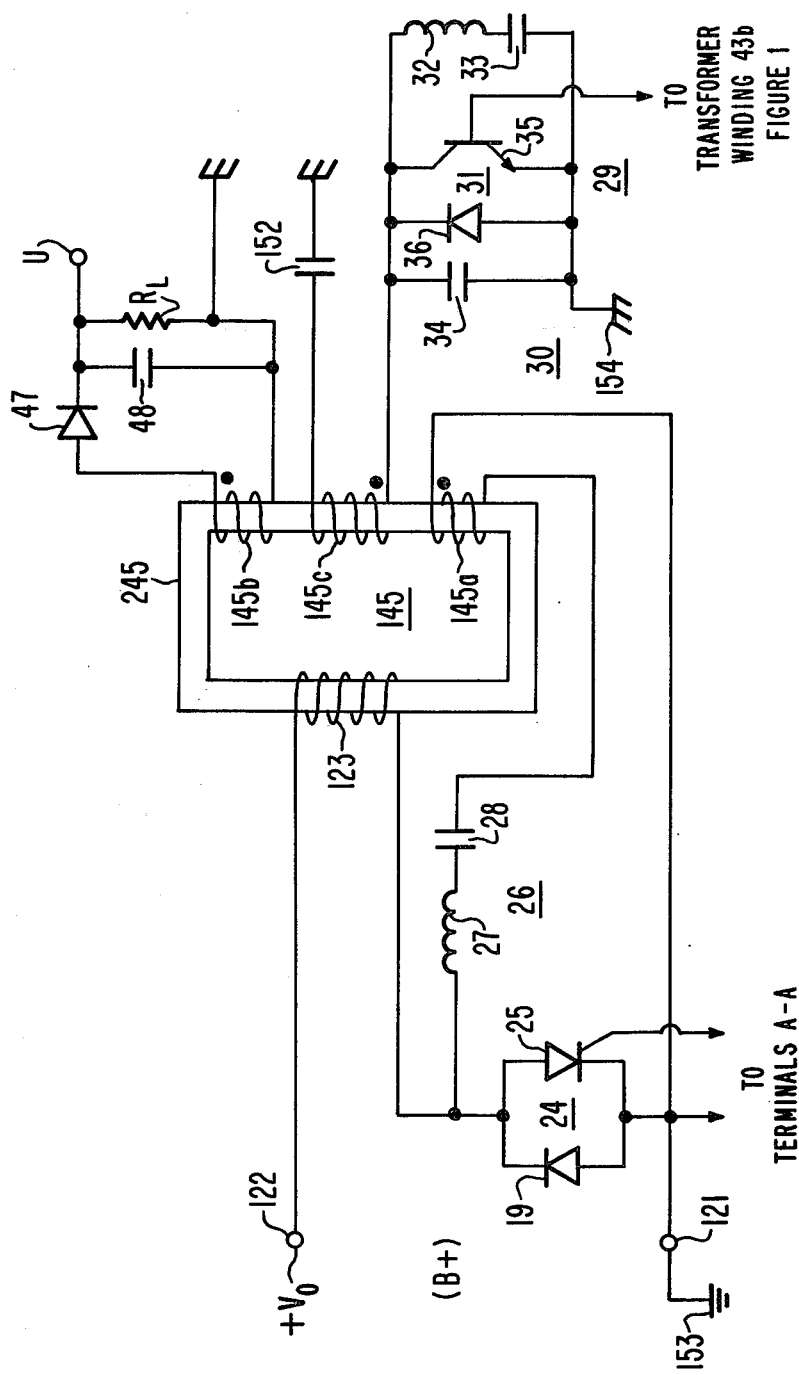
FIG. 3 illustrates another deflection circuit embodying the invention.

FIG. 3 illustrates another horizontal deflection circuit 30 embodying the invention. A B+ voltage supply of illustratively $V_0$ volts magnitude is coupled between terminals 121 and 122. The DC voltage may be obtained, for example, by rectification and filtering of the AC line mains voltage, not illustrated. A ground current return terminal designated 153, common with an AC line mains terminal, is coupled to terminal 121.

Horizontal output stage 29 is electrically isolated from the AC line mains supply by means of a transformer 145. The ground current return terminal for horizontal output stage 29 is designated 154. Transformer 145 may illustratively comprise a horizontal output or flyback transformer with a rectangular core 245.

Horizontal output stage 29, illustrated in FIG. 3, is coupled to a secondary winding 145c of transformer 145. One terminal of secondary winding 145c is coupled to trace switch 31 and to the resonant retrace circuit. The other terminal of winding 145c is coupled to a DC blocking and filtering capacitor 152. One terminal of a primary winding 145a of transformer 145 is coupled to capacitor 28 of resonant circuit 26. Another terminal of winding 145a is coupled to switch 24. A high voltage load is coupled to a high voltage winding 145b. Although windings 145a–145c are illustrated in FIG. 3 as side by side, to provide tight magnetic coupling between the windings, they may be wound one over another.

By means of transformer 145, resonant circuit 26 is magnetically coupled rather than conductively coupled to the resonant retrace circuit and to the trace switch of horizontal output stage 29.

When switch 24 conducts during retrace, energy is transferred through the magnetic field of transformer 145 from resonant circuit 26 to the resonant retrace circuit and other magnetically coupled loads such as the high voltage load $R_L$. With horizontal output stage 29 coupled to a secondary winding, the only load current flowing in secondary winding 145c and trace switch 31 is the relatively small current necessary to replenish dissipative losses in the horizontal output stage itself. Instead, a relatively large DC load current will flow in primary winding 145a, representing all the reflected DC load currents flowing in the load circuits magnetically coupled to primary winding 145a.

Because a reflected trace voltage is developed in winding 145a, the charging voltage developed across capacitor 28 of resonant circuit 26 between times $t_2-t_5$ of FIG. 4f is no longer similar to waveform 128. Rather, it is similar to either waveform 128a or 128b, depending upon the exact value of the reflected trace voltage and the value of the input B+ voltage.

An input choke 123 coupled between terminal 122 and switch 24 may be a separate electrical component, or, as illustrated in FIG. 3, may be a winding on transformer 145. By locating choke 123 on the leg opposite windings 145a-145c, the relatively large leakage inductance existing will effectively decouple the choke from the other windings. AC line mains isolation may also be achieved by using a separate input transformer as an input choke.

The circuit of FIG. 3 also provides for combined AC line mains and low voltage battery operation. Rectified AC line mains voltage may be coupled to terminals 121 and 122 whereas the battery voltage may be coupled directly to capacitor 152. When using one of the power sources, the other one would be disconnected from the circuit.

What is claimed is:
1. A deflection circuit, comprising:
a deflection winding;
a trace switch coupled to said deflection winding for generating a trace current in said deflection winding during a trace interval when said trace switch is closed;
a retrace capacitance coupled to said deflection winding for forming a first resonant circuit during a retrace interval when said trace switch is open;
a load circuit coupled to said first resonant circuit, said first resonant circuit transferring energy to said load circuit during said retrace interval;
a source of supply energy;
a second resonant circuit including a second capacitor for storing energy from said source;
means for charging said second capacitor from said source during said trace interval;
second switching means coupled to said second resonant circuit for developing a resonant current oscillation in said second resonant circuit during said retrace interval; and
means for coupling said first resonant circuit to said second resonant circuit for transferring stored energy from said second capacitor to said first resonant circuit during said retrace interval, said means for charging so coupled to said second capacitor and said means for coupling so arranged as to charge said second capacitor to a voltage polarity that will transfer stored energy in said second capacitor to said first resonant circuit prior to the occurrence of any polarity reversal in said second capacitor during said resonant current oscillation.

2. A circuit according to claim 1 wherein said load circuit comprises a flyback transformer.

3. A circuit according to claim 1, wherein said second resonant circuit is coupled to said trace switch, current flowing from said supply to said second resonant circuit through said trace switch.

4. A circuit according to claim 1 wherein the current flowing in said second resonant circuit commutates off said second switch.

5. A circuit according to claim 4 wherein said source of supply energy comprises a current source.

6. A circuit according to claim 5 wherein said current source comprises an inductance coupled to a DC voltage source.

7. A circuit according to claim 1 including a transformer, a first winding of said transformer coupled to said second resonant circuit, a second winding of said transformer coupled to said first resonant circuit.

8. A circuit according to claim 7 wherein said load circuit includes a high voltage winding of said transformer.

9. A horizontal deflection circuit, comprising:
a deflection winding;
a retrace capacitor coupled to said deflection winding for forming a resonant retrace circuit;
a resonant energy storage circuit coupled to said resonant retrace circuit;
an energy supply coupled to said resonant energy storage circuit for transferring energy from said energy supply to said resonant energy storage circuit;
a horizontal output device coupled to said deflection winding;
control means coupled to a control electrode of said horizontal output device for providing a turn-off bias signal to said device for generating a resonant retrace oscillation in said resonant retrace circuit; and
switching means coupled to said resonant energy storage circuit for disconnecting said resonant energy storage circuit from said energy supply during said resonant retrace interval, said resonant energy storage circuit transferring energy to said resonant retrace circuit when said turn-off bias signal causes said horizontal output device to become nonconductive.

10. A circuit according to claim 9, wherein the currents from said energy supply and the currents from said deflection winding flow in opposite directions through said horizontal output device toward the end of a trace interval.

11. A circuit according to claim 9 wherein the resonant oscillation frequency of said resonant energy storage circuit is approximately twice said resonant retrace oscillation frequency.

12. A circuit according to claim 11 wherein said switching means comprises a bidirectional switch, the current flowing in said resonant energy storage circuit commutating off said switching means.

13. A circuit according to claim 9, including a first winding of a horizontal output transformer coupled to said resonant energy storage circuit and a second winding of said horizontal output transformer coupled to said horizontal output device.

14. A circuit according to claim 13, including a capacitor serially coupled to said second winding and said horizontal output device.

15. A circuit according to claim 14 wherein said energy supply comprises an input choke winding on one leg said horizontal output transformer.

* * * * *